US010753962B2

(12) United States Patent
Testa et al.

(10) Patent No.: US 10,753,962 B2
(45) Date of Patent: Aug. 25, 2020

(54) SHRINKABLE CABLE JOINT AND VOLTAGE SENSOR

(71) Applicant: Prysmian S.p.A., Milan (IT)

(72) Inventors: Luigi Testa, Milan (IT); Stephane Tognali, Milan (IT)

(73) Assignee: PRYSMIAN S.P.A., Milan (IT)

( * ) Notice: Subject to any disclaimer, the term of this patent is extended or adjusted under 35 U.S.C. 154(b) by 0 days.

(21) Appl. No.: 16/667,078

(22) Filed: Oct. 29, 2019

(65) Prior Publication Data

US 2020/0132729 A1  Apr. 30, 2020

(30) Foreign Application Priority Data

Oct. 30, 2018  (EP) .................................... 18306422

(51) Int. Cl.
| | |
|---|---|
| *G01R 15/16* | (2006.01) |
| *H01B 7/18* | (2006.01) |
| *H01B 7/02* | (2006.01) |
| *H02G 15/18* | (2006.01) |
| *H05K 1/18* | (2006.01) |

(52) U.S. Cl.
CPC ........... *G01R 15/16* (2013.01); *H01B 7/0208* (2013.01); *H01B 7/18* (2013.01); *H02G 15/1806* (2013.01); *H05K 1/189* (2013.01); *H05K 2201/05* (2013.01); *H05K 2201/10151* (2013.01)

(58) Field of Classification Search
CPC ........ G01R 15/16; H01B 7/0208; H01B 7/18; H02G 15/1806; H05K 1/189; H05K 2201/05; H05K 2201/10151

USPC .......................................................... 174/91
See application file for complete search history.

(56) References Cited

U.S. PATENT DOCUMENTS 3,377,422 A  *  4/1968  Trimble .................. H02G 15/18
                                                 174/88 R
3,826,860 A  *  7/1974  De Sio ....................... H01R 4/08
                                                 174/73.1
(Continued)

FOREIGN PATENT DOCUMENTS

| DE | 3702735 A1 | 8/1988 |
|---|---|---|
| EP | 2763259 A1 | 8/2014 |

(Continued)

*Primary Examiner* — Timothy J Thompson
*Assistant Examiner* — Michael F McAllister
(74) *Attorney, Agent, or Firm* — Slater Matsil, LLP

(57) ABSTRACT

A shrinkable cable joint includes a joint insulating layer that surrounds a connection region configured to house two connected cable ends. A joint semiconductive layer surrounds the joint insulating layer. A joint screen layer surrounds the joint semiconductive layer. A joint sheath surrounds the joint screen layer. A capacitive voltage sensor is arranged between the joint screen layer and the joint semiconductive layer. The capacitive voltage sensor includes a sensor insulating layer having a first side and an opposite second side; a sensor electrode and a guard electrode arranged on the second side and directly contacting the joint semiconductive layer; and a sensor conductive layer arranged on the first side. The sensor conductive layer includes a first conductive layer portion in direct contact with the joint screen layer and electrically coupled to the guard electrode and a second conductive layer portion electrically coupled to the sensor electrode.

13 Claims, 8 Drawing Sheets

(56) References Cited

U.S. PATENT DOCUMENTS

| | | | | |
|---|---|---|---|---|
| 3,864,013 A * | 2/1975 | Levy | ............... | H01R 4/20 439/724 |
| 4,963,819 A * | 10/1990 | Clarke | ............... | G01R 15/16 324/126 |
| 5,041,027 A * | 8/1991 | Lien | ............... | H01R 13/53 174/84 S |
| 5,051,733 A * | 9/1991 | Neuhouser | ............... | G01R 19/155 174/73.1 |
| 9,219,318 B2 * | 12/2015 | Portas | ............... | H02G 15/1826 |
| 9,270,031 B2 * | 2/2016 | Portas | ............... | H01R 4/10 |
| 9,306,382 B2 * | 4/2016 | Ladie | ............... | H02G 15/24 |
| 9,640,904 B2 * | 5/2017 | Weinmann | ............... | H01R 13/5845 |
| 2002/0171433 A1 * | 11/2002 | Watanabe | ............... | G01R 15/16 324/539 |
| 2005/0218905 A1 * | 10/2005 | Prunk | ............... | G01R 31/1272 324/544 |
| 2008/0257259 A1 * | 10/2008 | Vallauri | ............... | H02G 1/14 118/500 |
| 2011/0298454 A1 * | 12/2011 | Ausserlechner | ............... | G01R 19/00 324/252 |
| 2012/0273246 A1 * | 11/2012 | Luzzi | ............... | H02G 15/1833 174/91 |
| 2014/0368221 A1 * | 12/2014 | Weinmann | ............... | G01R 15/16 324/658 |
| 2016/0139181 A1 * | 5/2016 | Gravermann | ............... | G01R 27/2605 324/686 |
| 2017/0030946 A1 * | 2/2017 | Gravermann | ............... | G01R 15/142 |

FOREIGN PATENT DOCUMENTS

| | | |
|---|---|---|
| EP | 3002594 A1 | 4/2016 |
| WO | 2012130816 A1 | 10/2012 |
| WO | 2016045692 A1 | 3/2016 |

* cited by examiner

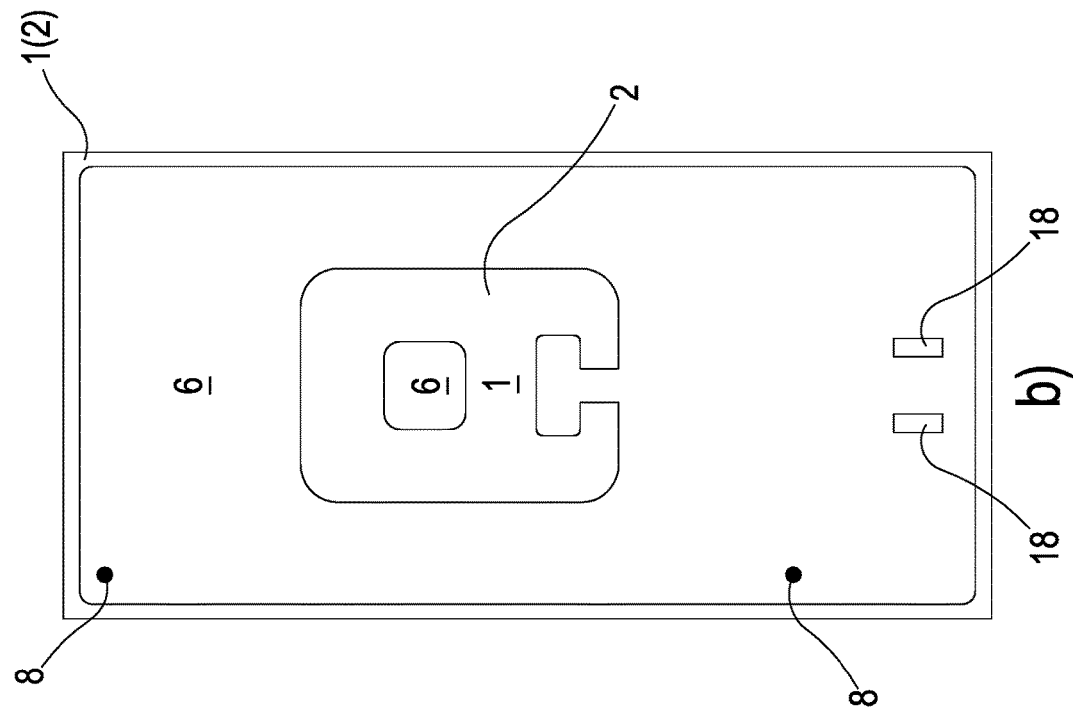
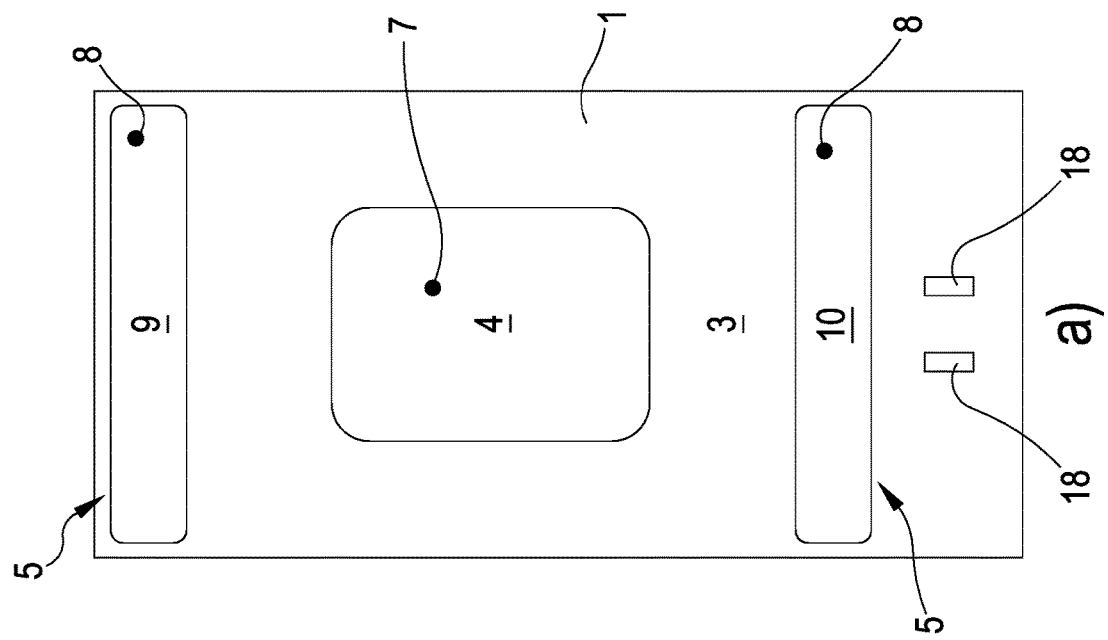
FIG.3

SHRINKABLE CABLE JOINT AND VOLTAGE SENSOR

CROSS-REFERENCE TO RELATED APPLICATIONS

This application claims the benefit of European Patent Application No. 18306422.9 filed on Oct. 30, 2018, which application is hereby incorporated herein by reference.

TECHNICAL FIELD

The present disclosure relates to cable joints, and in particular embodiments to shrinkable cable joint and voltage sensor.

BACKGROUND

Shrinkable joints, either cold or heat shrinkable, employed to connect high or medium voltage cables and provided with capacitive voltage test sockets comprising a metallic insert for detecting the presence of voltage in cable lines are known.

US2012/0273246 discloses a cold shrinkable primary joint of the type provided with a capacitive voltage socket. The joint described by this document comprises an electrically conductive rubber exterior, an electrically and thermally conductive insert that serves as a Faraday cage, and an insulating material disposed between the electrically and thermally conductive insert and the electrically conductive rubber exterior. Moreover, the joint is provided with a capacitive test point structure having a capacitive test point that extends down into the insulating material towards the insert and out beyond the electrically conductive rubber exterior.

WO 2012/130816 relates to an apparatus for measuring the potential on a shielded high voltage cable. A capacitive sensor arrangement is constructed on a cable. The capacitive sensor includes a sensor comprising a sensing electrode positioned on the semiconducting layer of the cable, a dielectric layer and an electrostatic shield. The capacitive sensor includes a coaxial conductor that provides electrical connection to the sensing electrode, by a corresponding wire connection, and to the electrostatic shield by another wire connection.

SUMMARY

According to a first aspect, the present disclosure relates to a shrinkable joint comprising: a joint insulating layer surrounding a connection region configured to house two electrically connected cable ends; a joint semiconductive layer surrounding the joint insulating layer; a joint screen layer surrounding the joint semiconductive layer; a joint sheath surrounding the joint screen layer; and a capacitive voltage sensor arranged between the joint screen layer and the joint semiconductive layer and comprising: a sensor insulating layer having a first side and an opposite second side; a sensor electrode and a guard electrode arranged on the second side and directly contacting the joint semiconductive layer; a sensor conductive layer arranged on the first side and comprising a first conductive layer portion in direct contact with the joint screen layer and electrically connected to the guard electrode; and a second conductive layer portion electrically connected to the sensor electrode; the conductive layer extending on the first side.

In an embodiment, the capacitive voltage sensor has a planar structure being, for example, of one of the following shapes: rectangular shape, quadrangular shape, circular shape. In an embodiment, the capacitive voltage sensor is flexible.

In an embodiment, the sensor electrode and guard electrode are flexible. In an embodiment, the sensor electrode and guard electrode have planar shapes.

In an embodiment, the first conductive layer portion and the second conductive layer portion are flexible. In an embodiment, the first conductive layer portion and the second conductive layer portion have planar shapes.

In an embodiment, the joint of the present disclosure further includes a sensor insulating layer arranged to electrically insulate the first conductive layer portion from the second conductive layer portion. For example, the sensor insulating layer is made of a material selected from: polyester; polyethylene terephthalate (PET); polyethylene naphthalate (PEN); polyimide.

In an embodiment, the first conductive layer portion has a first area greater than a second area of the second conductive layer portion.

For example, the sensor electrode, guard electrode and conductive layer are made of a material selected from: a metal like copper, tinned copper, silver, or gold; carbon, carbon nano-tube, a conductive polymer, or composites thereof.

In an embodiment, the capacitive voltage sensor is made according to a Flexible Printed Circuit (FPC) Technology.

In an embodiment, the sensor insulating layer comprises: a first conductive element connecting the guard electrode with first conductive layer portion and a second conductive element connecting the sensor electrode with the second conductive layer portion.

In an embodiment, the joint of the present disclosure further comprises a signal cable comprising: a first conductor having a first end electrically connected to the second conductive layer portion and a second end connected to an output port; a second conductor having a respective third end electrically connected to the first conductive layer portion of the conductive layer and a respective fourth terminal connected to the output port. The signal cable can be one of the following cable types: coaxial cable, twisted-pair cable, shielded flat cable.

For example, the sheath of the joint can be made of an elastomeric material selected from: ethylene propylene rubber (EPR); ethylene propylene diene monomer rubber (EPDM); silicone rubber, butyl rubber.

In an embodiment, the capacitive voltage sensor is arranged in the joint of the present disclosure to detect a voltage signal dependent on: a capacitance value associated with the joint insulating layer; a first resistance value associated with a portion of the joint semiconductive layer faced to a longitudinal region extending between the sensor electrode and a first portion of the guard electrode; and a second resistance value associated with a further portion of the semiconductive layer faced to a further region extending between the sensor electrode and a second portion of the guard electrode, the sensor electrode being arranged between the first portion and the second portion. In accordance with another aspect, the present disclosure relates to a capacitive voltage sensor comprising: a sensor insulating layer having a first side and an opposite second side; a sensor electrode and a guard electrode arranged on the second side; a sensor conductive layer arranged on the first side and comprising a first conductive layer portion electrically connected to the guard electrode a second conductive layer portion electrically connected to the sensor electrode; the conductive layer extending on the first side. According to a third aspect, the present disclosure relates to a power distribution system comprising two cable conductors spliced in a shrinkable cable joint (200) comprising: a joint insulating layer surrounding a connection region configured to house the spliced cable conductors; a joint semiconductive layer surrounding the joint insulating layer; a joint screen layer surrounding the joint semiconductive layer; a joint sheath surrounding the joint screen layer; and a capacitive voltage sensor arranged between the joint screen layer and the joint semiconductive layer and comprising: a sensor insulating layer having a first side and an opposite second side; a sensor electrode and a guard electrode arranged on the second side and directly contacting the joint semiconductive layer; a sensor conductive layer arranged on the first side and comprising a first conductive layer portion in direct contact with the joint screen layer and electrically connected to the guard electrode and a second conductive layer portion electrically connected to the sensor electrode; the sensor conductive layer extending on the first side.

BRIEF DESCRIPTION OF THE DRAWINGS

Further characteristics and advantages will be more apparent from the following description of a preferred embodiment and of its alternatives given as a way of an example with reference to the enclosed drawings in which:

FIGS. 3a and 3b show, respectively, a bottom view and a top view of another embodiment of the capacitive voltage sensor of the disclosure;

DETAILED DESCRIPTION OF ILLUSTRATIVE EMBODIMENTS

For the purpose of the present description and of the appended claims, except where otherwise indicated, all numbers expressing amounts, quantities, percentages, and so forth, are to be understood as being modified in all instances by the term "about". Also, all ranges include any combination of the maximum and minimum points disclosed and include any intermediate ranges therein, which may or may not be specifically enumerated herein.

As used in the present description and the appended claims, the singular forms "a," "an," and "the" include plural referents unless the context clearly dictates otherwise. In this specification and in the claims that follow, reference will be made to a number of terms that shall be defined to have the following meanings unless a contrary intention is apparent.

For the purpose of the present description and of the appended claims, the term "conductive" and "semiconductive" are construed to mean "electrically conductive" and "electrically semiconductive".

In the following description, same alphanumeric references are used for analogous exemplary elements when they are depicted in different drawings.

With reference to prior art capacitive voltage test sockets, the Applicant observes that the voltage output is, typically, of the order of magnitude of 1 kV so there are potential safety issues for the operator, also because for accessing a capacitive insert to collect the detected voltage the sensor accessory cannot be electrically screened and a fault current cannot be drained to ground through the joint semi-conductive material without increasing temperature and voltage. Moreover, as the sensor accessory comprises a rigid metal insert, it is not elastic and, especially, it cannot shrink to adapt to the joint modification in view of the cable size.

The Applicant observed that the known shrinkable joints show drawbacks in terms of safety performances and elasticity of their structures. The Applicant further noted that voltage sensors showing compact and non-complex structures that facilitate integration in electrical components, such as shrinkable cable joints, are needed.

The Applicant has found that a capacitive voltage sensor having an insulating layer having sensor and guard electrodes on a side and a conductive layer extending on the opposite side and electrically contacting both sensor and guard electrodes, is suitable to meet safety, elasticity and adjustability issues, with particular reference to the incorporation in shrinkable joints, either cold or heat shrinkable.

Figure 1:
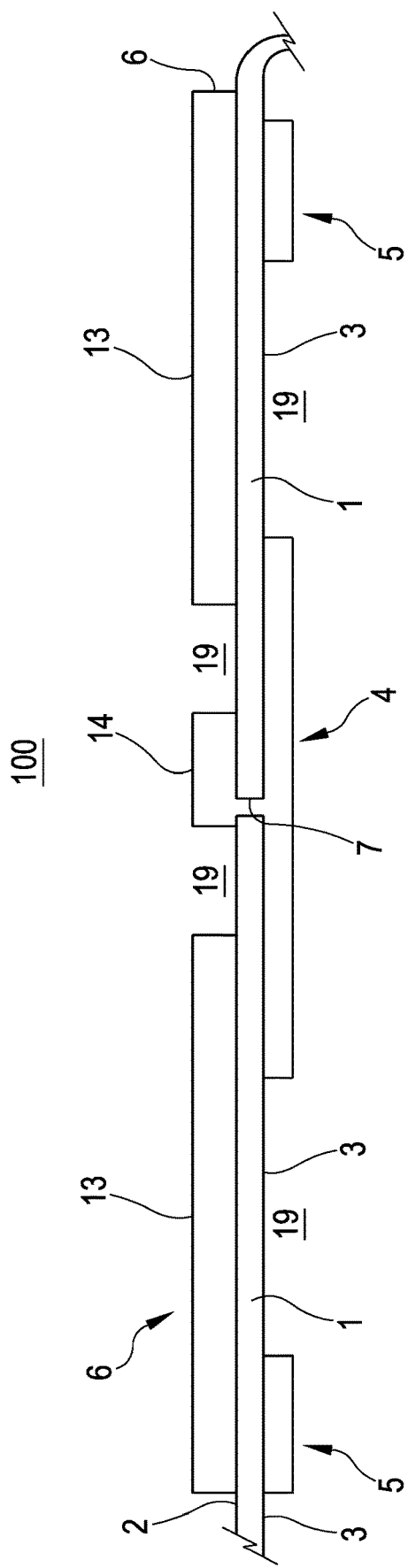
FIG. 1 shows, schematically, a longitudinal sectional view of a capacitive voltage sensor according to an embodiment of the present disclosure.
Figure 2:
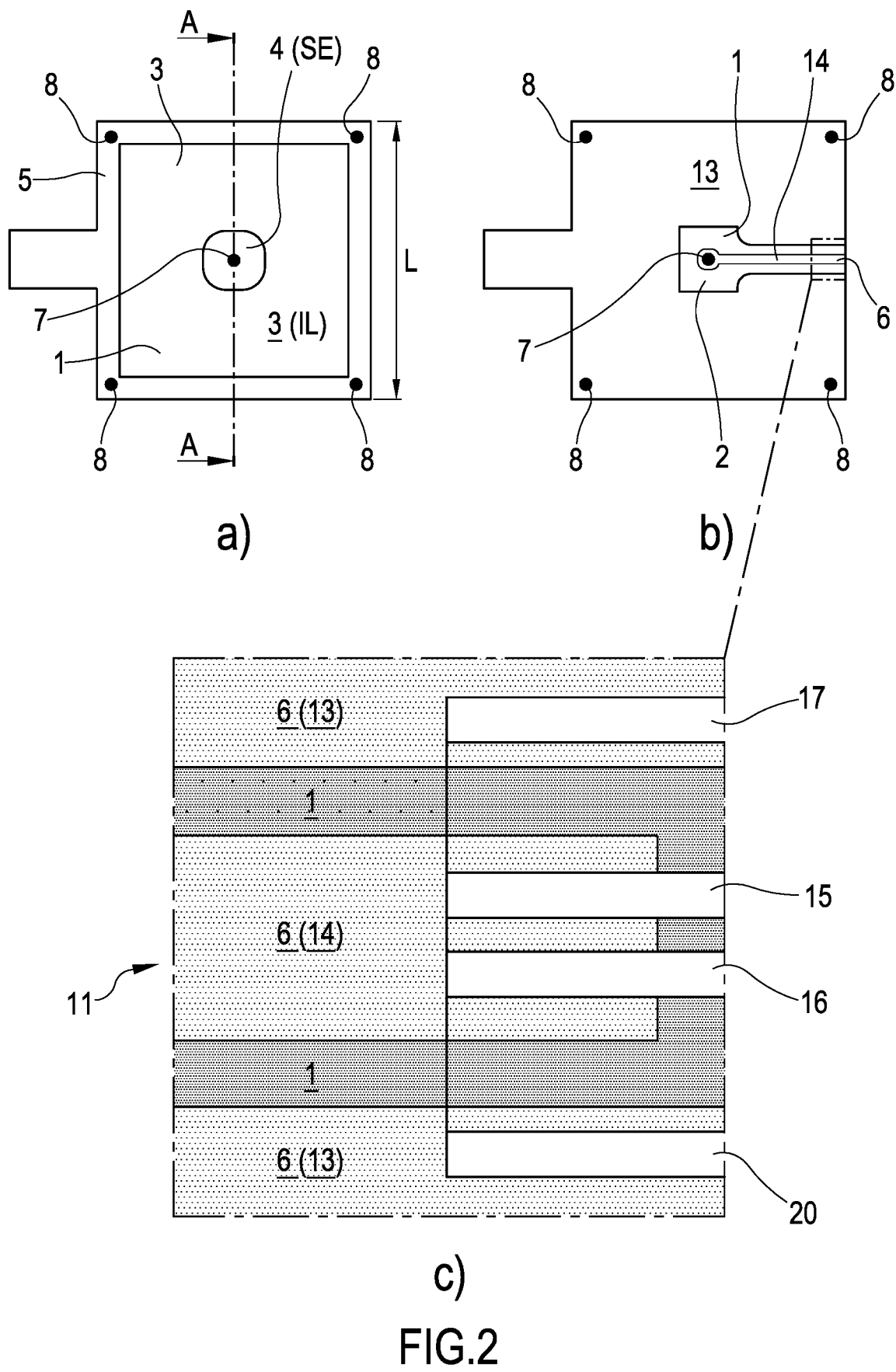
FIGS. 2a, 2b, 2c show the capacitive voltage sensor of FIG. 1 in a bottom view (FIG. 2a), top view (FIG. 2b) and further details of the top view (FIG. 2c)

FIG. 1 shows a longitudinal sectional view of a capacitive voltage sensor 100 which can be integrated into a cable joint as from the present disclosure. The representation of FIG. 1 is schematic and not necessarily in the correct scale. FIGS. 2a and 2b show possible bottom view and a top view, respectively, of the capacitive voltage sensor 100 of FIG. 1.

The capacitive voltage sensor 100 comprises a sensor insulating layer 1, defining a first side 2 and an opposite second side 3. A sensor electrode 4 is placed on the second side 3 of the sensor insulating layer 1. In the present embodiment, the sensor electrode 4 covers only a portion of the surface of the second side 3.

The capacitive voltage sensor 100 also comprises one guard electrode 5 placed on the second side 3 of the sensor insulating layer 1. As from FIG. 2a, the guard electrode 5 of the present embodiment has a closed ring form and is laid on the second side 3 so as to circumscribe the sensor electrode 4. The guard electrode 5 is electrically isolated from the sensor electrode 4. As an example, the guard electrode 5 is spatially separated from the sensor electrode 4 (as in the present case) and/or an interposed insulating material ensures the reciprocal electrical isolation. For example, the sensor electrode 4 and the guard electrode 5 are flexible and have, particularly, planar shapes.

The capacitive voltage sensor 100 is provided with a sensor conductive layer 6 placed on the first side 2. The sensor conductive layer 6 can have the function of screen layer for shielding the sensor electrode 4 and the guard electrodes 5 from external noise. In an example, the conductive layer 6 is flexible and has, in particular, a planar shape.

In the present embodiment, the sensor conductive layer 6 covers the majority of the first side 2 of the sensor insulating layer 1, for example the conductive layer 6 covers a percentage of the area of the sensor insulating layer 1 greater than 60%, more preferably greater than 80%.

The sensor conductive layer 6 includes a first conductive layer portion 13 and a second conductive layer portion 14. The first conductive layer portion 13 is at least partially faced toward the guard electrode 5 and the second conductive layer portion 14 is at least partially faced toward the sensor electrode 4. The first conductive layer portion 13 is electrical isolated from the second conductive layer portion 14. As an example, the first conductive layer portion 13 is spatially separated from the second conductive layer portion 14 and/or an interposed insulating material ensures the reciprocal electrical isolation. As will be described in detail hereinafter, the first conductive layer portion 13 and the second conductive layer portion 14 further to the above mentioned shielding function play also the roles of electrical contacts with a signal cable.

The sensor insulating layer 1 includes a first contacting element 7 (FIG. 1) and second contacting elements 8 (FIGS. 2a and 2b) extending in holes formed through the sensor insulating layer 1. The first contacting element 7 connects the sensor electrode 4 with the second conductive layer portion 14, and the second contacting elements 8 connect the guard electrode 5 with the first conductive layer portion 13 of the conductive layer 6.

In an embodiment of the present disclosure, the capacitive voltage sensor 100 is manufactured according to the Flexible Printed Circuit (FPC) Technology. The sensor insulating layer 1 can be made in one of the following materials: a polyester, such as PET or PEN, or a polyimide, such as poly (4,4'-oxydiphenylene-pyromellitimide) (marketed as Kapton™ by DuPont). The guard electrode 5 and the sensor electrode 4 can be in form of copper foil, optionally finished by tin, silver foil, carbon foil, carbon nano-tube foil, gold foil or a conductive polymer layer, or in form of an ink or a paint.

The conductive material forming the first contacting element 7 and the second contacting elements 8 can be copper, aluminium, carbon, conductive polymer. The sensor conductive layer 6 is made, as an example, in one of the materials listed for the sensor electrode 4 and the guard electrode 5. Particularly, it is observed that the material of the sensor insulating layer 1 may at least partially fill gap zones 19 between the sensor electrode 4 and the guard electrode 5 and, as an example, between the first conductive layer portion 13 and the second conductive layer portion 14 (FIG. 1).

The capacitive voltage sensor 100 of FIGS. 1 and 2a-2c has, as an example, a parallelepiped body where the sensor electrode 4 (having, in this case, a quadrangular shape) is placed in a central area of the second side 3, and the guard electrode 5 has a quadrangular shape surrounding the sensor electrode 4. In alternative embodiments, the capacitive voltage sensor 100 may have different shapes, for example, rectangular or circular shape, and the sensor electrode 4, the guard electrode 5, the first conductive layer portion 13 and/or the second conductive layer portion 14 may vary in shape accordingly.

FIG. 2c shows a portion of the capacitive voltage sensor 100. According to the shown example, this portion includes ends of a signal cable employed to provide a sensor signal outside the capacitive voltage sensor 100.

According to the particular example of FIGS. 2a-2c, the capacitive voltage sensor 100 is connectable with a signal cable 400 (shown in FIGS. 4-7) comprising a first wire end 17, connected to the first conductive layer portion 13 of the sensor conductive layer 6 to carry a reference signal, and a second wire end 15, connected to the second conductive layer portion 14 to carry a sensor signal. As an example, the signal cable 400 is a twisted pair cable comprising the first wire end 17 and the second wire end 15. The capacitive voltage sensor 100 may be connected with a redundant signal cable comprising a third wire end 16 connected to the second conductive layer portion 14 to carry the guard signal, and a fourth wire end 20 connected to the first conductive layer portion 13 to carry the sensor signal.

In the embodiment of FIGS. 2a-2c, the capacitive voltage sensor 100 is manufactured according to the FPC technology; the sensor insulating layer 1, made of Kapton™, has a thickness of 35 μm; and the capacitive voltage sensor 100 has a side length L of 50 mm.

FIGS. 3a and 3b show another embodiment of the capacitive voltage sensor 100 according to the present disclosure. In this embodiment, the capacitive voltage sensor 100 has a parallelepiped shape and the guard electrode 5 is divided into two portions, a first portion 9 and a separated second portion 10 which are, in the present case, substantially equidistant from the sensor electrode 4. As from FIG. 3b, the sensor conductive layer 6 and the second connecting elements 8 electrically connect the first portion 9 with the second portion 10 of the guard electrode 5. As shown in FIG. 3b the sensor comprises holes 18 that allows connection to the signal cable 400.

FIGS. 4-7 refer to sectional views of a joint 200, which can be a cold shrinkable joint. The joint 200 shown in FIG. 4-7 is installed over a metallic connector 500 used to splice together two cable conductors 300, 302. The joint 200 can be employed in medium voltage power distribution systems.

The metallic connector 500 can be a known shear bolt connector (provided with an aluminium foil) which connects a first cable conductor 300 of a first cable end 301 with a second cable conductor 302 of a second cable end 303. According to an example, the two jointed cables are single-core medium-voltage cables.

Each of the first 301 and second cable end 303 includes a cable insulation layer 304, surrounding the first cable conductor 300 and second cable conductor 302, respectively.

Figure 4:
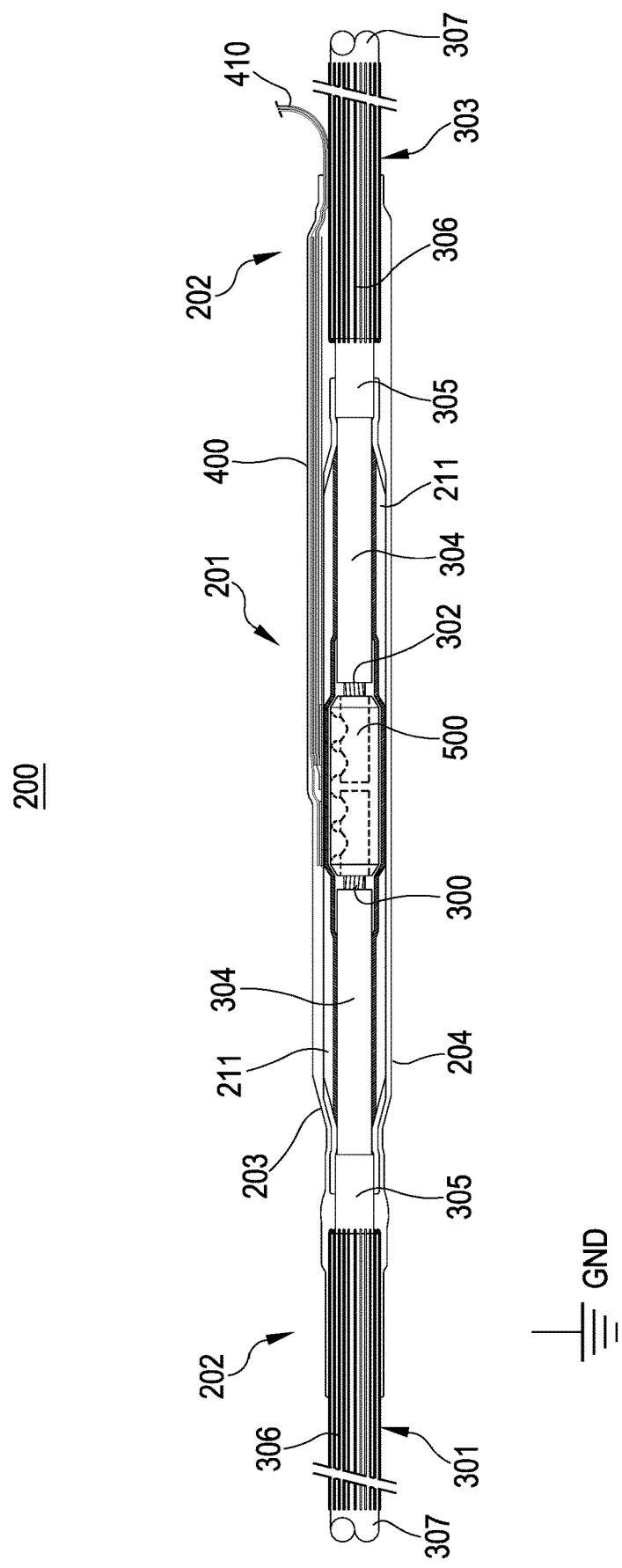
FIG. 4 shows a longitudinal sectional view of an embodiment of a joint according to the present disclosure comprising a capacitive voltage sensor.
Figure 7:
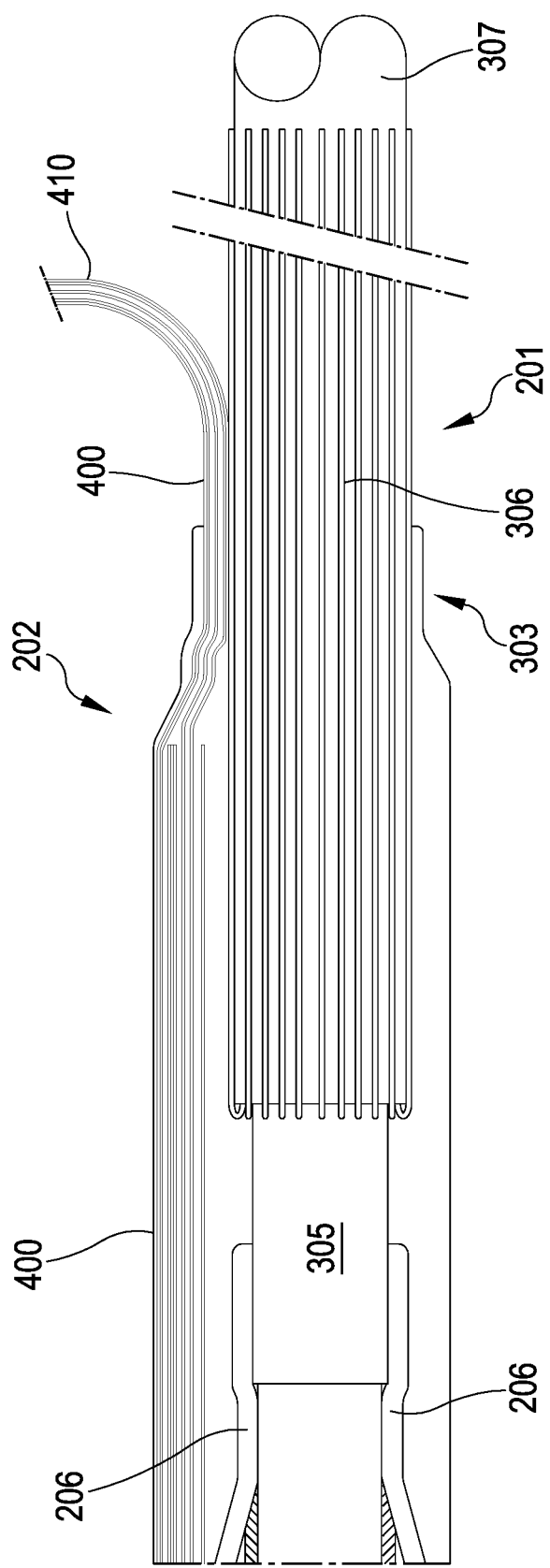
FIG. 7 shows, in a longitudinal sectional view, another side portion of the joint of FIG. 4.

Each of the first 301 and the second cable end 303 is provided with a cable semiconductive layer 305. Each of the first 301 and the second cable end 303 further includes a cable screen 306 laying on a corresponding cable sheath 307, as result of the installation procedure (FIGS. 4 and 7). The cable screen 306 can be made of wires, helically wound tapes or a longitudinally folded foil. The cable screen material can be copper, aluminium, lead or a composite thereof.

The joint 200 has a substantially cylindrical shape and comprises a central portion 201 and two end portions 202 connected to a respective end of the central portion 201. The joint 200 is made by a plurality of coaxial layers having substantially tubular shapes. In particular and with reference to FIG. 5, the joint 200 comprises (from the outside to the inside) a joint sheath 203, a joint screen layer 204 (made, for example, in the form of a metal braid), a joint semiconductive layer 206 and a joint insulating layer 211 and, in this embodiment, a high permittivity layer 212 and a high permittivity mastic structure 213. The joint insulating layer 211 surrounds a connection region configured to house metallic connector 500.

The joint sheath 203 can be made of an elastomeric material, such as ethylene propylene rubber (EPR), ethylene propylene diene monomer rubber (EPDM), silicone rubber, butyl rubber. The joint insulating layer 211 can be made, as an example of: EPR, EPDM, silicone rubber; butyl rubber.

The joint semiconductive layer 206 can be made in the same material of the joint insulating layer 211 and include, in addition, a conductive filler (such as, carbon black) so as to reach the required conductivity, e.g. a conductivity comprised between $10^{-1}$ and 10 S/m.

The joint sheath 203, the joint screen layer 204 and the joint semiconductive layer 206 extends from the central portion 201 to the two end portions 202. The central portion 201 and the two end portions 202 show an elastic behaviour.

It is noticed that the materials used for manufacturing the joint 200 are of the type that allow the joint 200 to perform a cold shrink over the interconnected cable ends.

The joint 200 comprises a capacitive voltage sensor 100 and a signal cable 400 (e.g. a coaxial cable). The capacitive voltage sensor 100 is arranged between the joint screen layer 204 and the joint semiconductive layer 206, and is kept in place by a semiconducting tape or elastic sleeve 210 provided in radial internal position with respect to the joint screen layer 204. The semiconducting tape 210 extends in the central region 201.

An insulating filler 205 (in form, for example, of a tape) partially covers the capacitive voltage sensor 100 and is in radial internal position with respect to the semiconducting tape 210. For example, the insulating filler is made in a material selected from: polyvinyl chloride (PVC); ethylene propylene rubber (EPR); ethylene-propylene diene monomer (EPDM); silicone rubber; butyl rubber.

As the capacitive voltage sensor 100 is positioned in the joint 200 so that the first side 2 is radially external to the second side 3, in an embodiment the insulating filler 205 may also provide for insulation of the first conductive layer portion 13 from the second conductive layer portion 14.

The guard electrode 5 and the sensor electrode 4 are in direct contact with the joint semiconductive layer 206. As an example, the semiconductive layer 206 may at least partially fill the gap zone 19 (FIG. 1), such as the gap between the sensor electrode 4 and the guard electrode 5. According to the example shown, a portion of the sensor conductive layer 6 is in direct contact with an inner face of the semiconducting tape 210 and another portion of the sensor conductive layer 6 is in contact with the insulating filler 205. In another, not illustrated embodiment, sensor conductive layer 6 fully contacts the semiconducting tape 210 on one side and cable screen 204 on the other side.

The signal cable 400 extends from the capacitive voltage sensor 100 to one of joint end portions 202 where has an output port 410 (FIGS. 4 and 7). The signal cable 400 of the embodiments of FIGS. 4-7 is a coaxial cable but, as already described, other types of cables can be used, such as twisted-pair cables or shielded flat cables.

Figure 5:
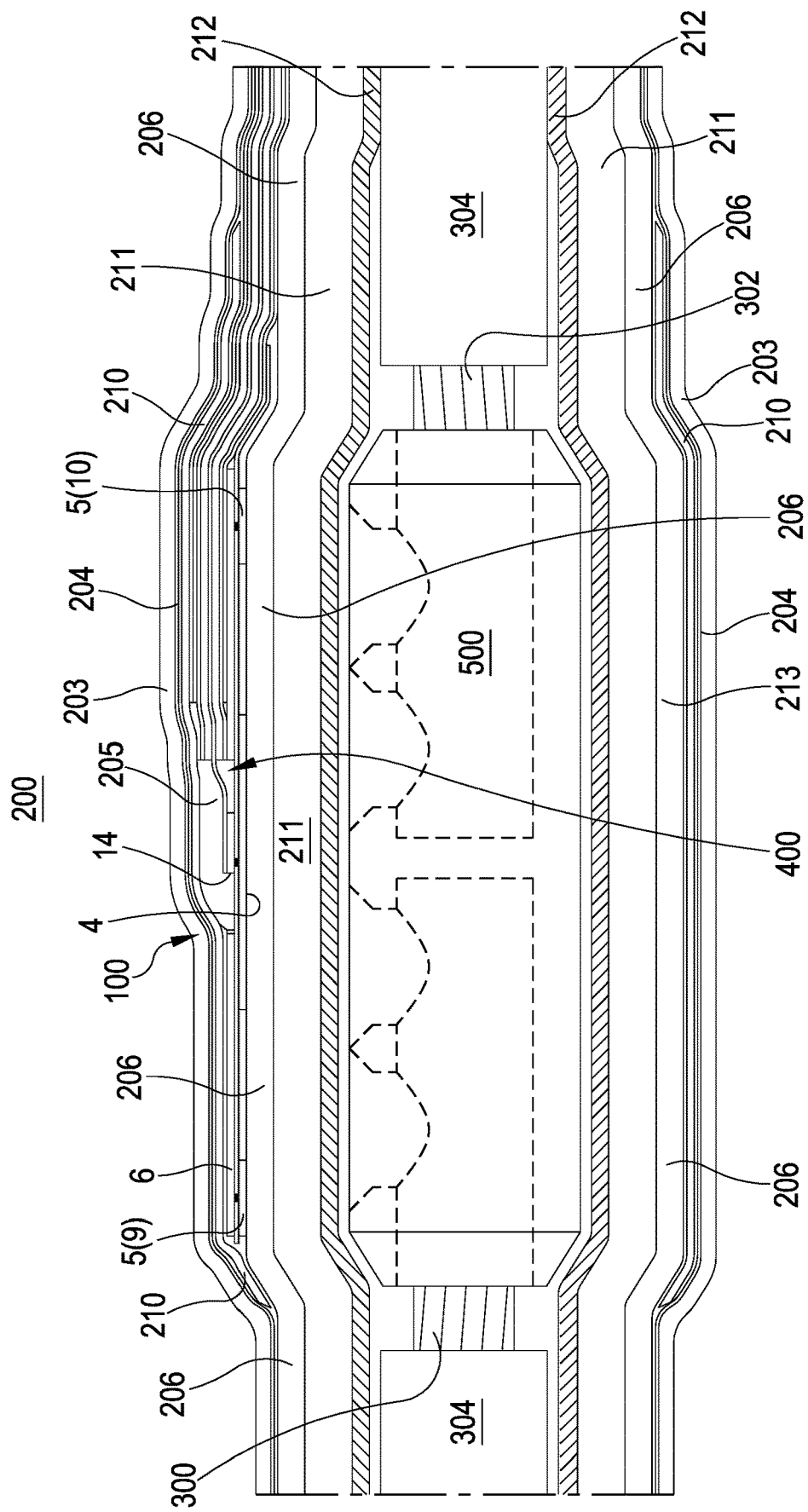
FIG. 5 shows a longitudinal sectional view of a centre portion of the joint of FIG. 4.
Figure 6:
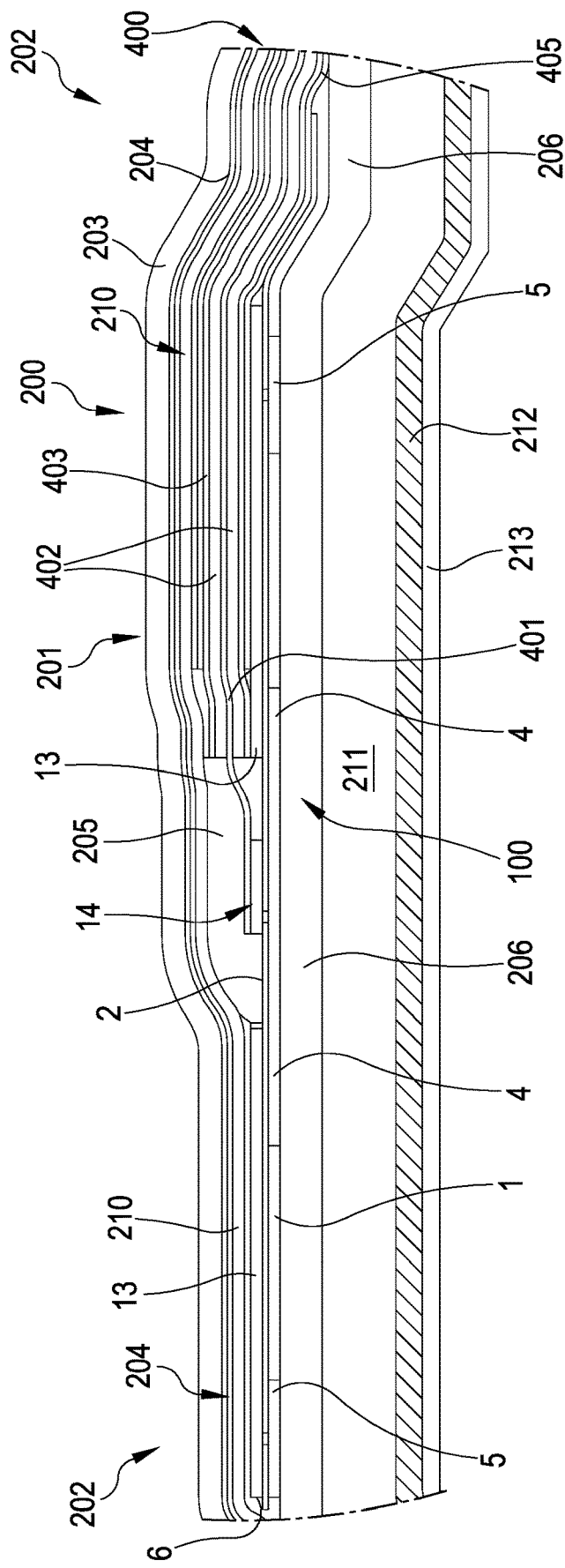
FIG. 6 shows, in a longitudinal sectional view, a side portion of the joint of FIG. 4.

The signal coaxial cable 400 of FIGS. 4-7 comprises a core conductor 401, a dielectric insulator 402 and a conducting shield 403 (FIG. 6). The core conductor 401 is connected, e.g. via a soldering, to the second conductive layer portion 14 and the conducting shield 403 is connected to the first conductive layer portion 13 of the conductive layer 6. The output port 410 is configured to be connected to an external connector employed to transfer a detected voltage signal toward an external device.

The signal coaxial cable 400 is also provided with a cable jacket 405 surrounding the conducting shield 403. In an embodiment, an end of the conducting shield 403 is connected to the first conductive layer portion 13 to allow direct electrical contact (with or without the interposition of a soldering material) so avoiding the necessity an internal connection wire.

Once positioned onto the metallic connector 500, as known to the skilled person, the joint 200 is made to collapse on the first 301 and second 303 cable ends, for example by a cold shrink action. As an example, joint 200 can be mounted in a manner analogous to the one employed for the cold-shrink cable splice Elaspeed® marketed by the Applicant. The sensor electrode 4 is arranged so as to be capacitively coupled with the metallic connector 500 to detect a voltage detected signal depending on an electrical voltage of the first 301 and second cable ends 303.

It is observed that the presence of the capacitive voltage sensor 100 encompassed in the joint 200 does not make more complex the joint installation steps.

In operation, the cable screen 306 of the first 301 and second cable ends 303, together with the screen layer 204 of the joint 200, are connected to a ground terminal GND (FIG. 4). As from FIG. 5, in the capacitive voltage sensor 100, the sensor electrode 4 and the guard electrode 5 are in direct contact with the joint semiconductive layer 206. The first conductive layer portion 13 is electrically connected to the joint screen layer 204, via the semiconducting tape 210 (which represents a low impedance link), and so the guard electrode 5 is electrically connected to the ground terminal GND. The guard electrode 5, connected to the ground terminal GND via a low impedance link, imparts ground potential to the region of the joint semiconductive layer 206 to which it is in contact.

If there is a non-zero electric AC voltage along the cables jointed by the metallic connector 500, an electrical current is induced by capacitive coupling in the joint semiconductive layer 206. Therefore, this capacitive current passes through the joint semiconductive layer 206 to flow up to the ground terminal GND causing a voltage drop in the joint semiconductive layer 206. The sensor electrode 4 and the second conductive layer portion 14 harvest such voltage drop and transmit a corresponding voltage signal to the core conductor 401 of the signal coaxial cable 400 so this voltage signal can be conveyed outside the joint 200 via the output port 410. Moreover, the conducting shield 403 of the signal coaxial cable 400 provides the ground voltage assumed by the guard electrode 5 to the output port 410; the ground voltage represents a reference signal for the measure of a voltage value associated with the voltage signal detected by the sensor electrode 4. The voltage signal conveyed outside the joint 200 can be measured by a voltmeter or another measuring device connected to the output port 410 and the measured voltage value depends on the voltage of the electrical current flowing in the cable connector 500.

Figure 8:
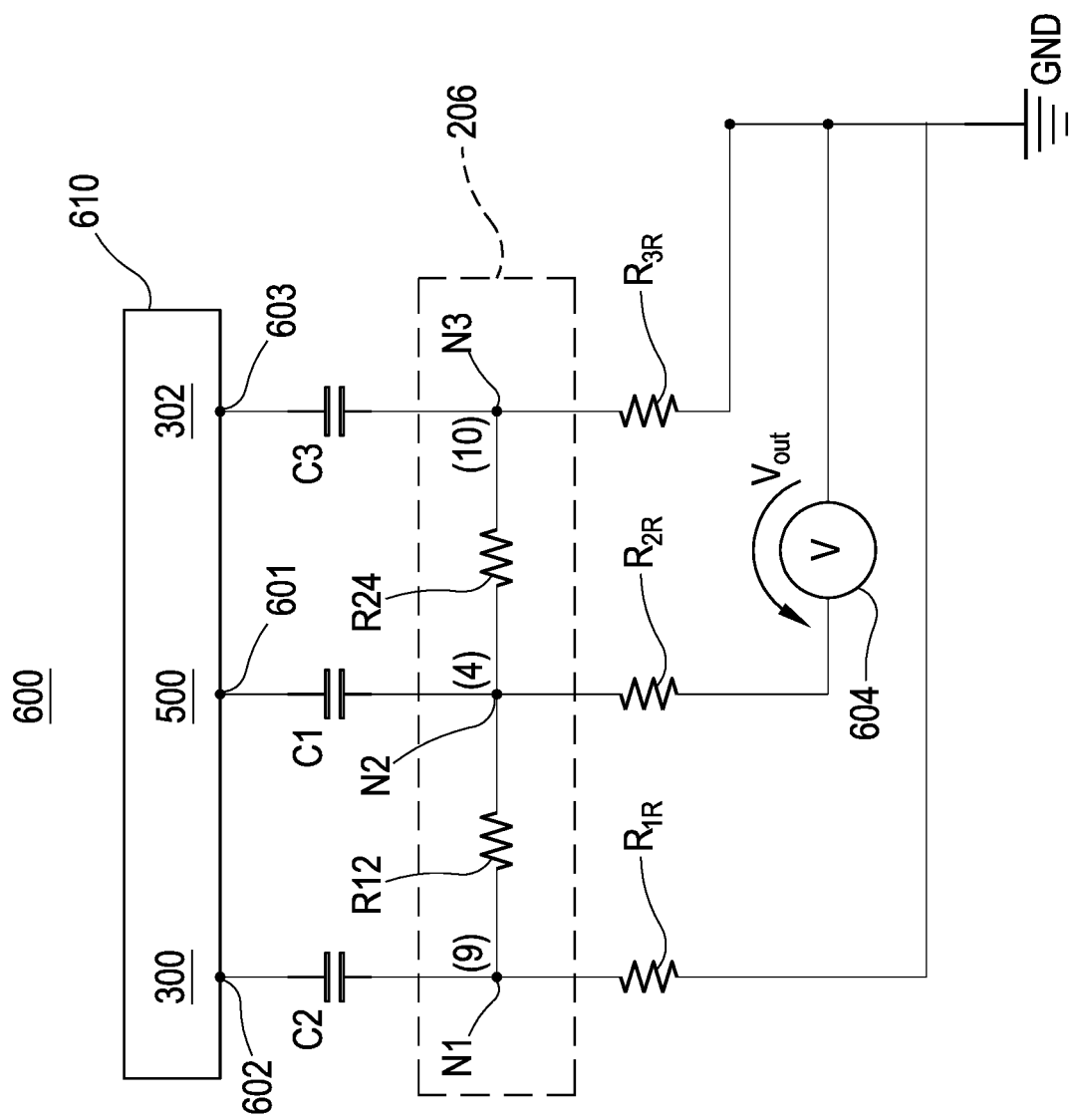
FIG. 8 shows an equivalent electrical circuit illustrating the operation of the voltage sensor of the present disclosure.

FIG. 8 shows an electrical circuit 600 equivalent to the components of the joint 200 involved in the voltage sensing. Particularly, the following description refers to the capacitive voltage sensor 100 of FIG. 3 where the guard electrode 5 comprises a first portion 9 and a second portion 10, but it is valid in an analogous manner also for the embodiment of FIGS. 1 and 2.

In the equivalent circuit of FIG. 8 an electrical component 610, comprising the metallic connector 500, the first cable conductor 300 and the second cable conductor 302, is provided with a first terminal 601, a second terminal 602 and a third terminal 603. The first terminal 601 is connected to a first capacitive component C1 representing the capacitance of the portion of the joint insulating layer 211 comprised between the sensor electrode 4 and the metallic connector 500 (FIG. 5). The second terminal 602 is connected to a second capacitive component C2 representing the capacitance of the portion of the joint insulating layer 211 comprised between the first portion 9 of the guard electrode 5 and the metallic connector 500. The third terminal 603 is connected to a third capacitive component C3 representing the capacitance of the portion of the joint insulating layer 211 comprised between the second portion 10 of the guard electrode 5 and the metallic connector 500.

A first resistor $R_{1L}$ represents a resistance of a longitudinal portion of the joint semiconductive layer 206 faced to a region extending between the first portion 9 of the guard electrode 5 and the sensor electrode 4. A second resistor $R_{2L}$ represents a resistance of another longitudinal portion of the joint semiconductive layer 206 faced to a further region extending between the sensor electrode 4 and the second portion 10 of the guard electrode 5.

A third resistor $R_{1R}$, a fourth resistor $R_{2R}$ and fifth resistor $R_{3R}$ respectively represent the radial resistances of the portions of the joint semiconductive layer 206 in contact with the sensor electrode 4, the first portion 9 and second portion 10 of guard electrode 5.

Particularly, the second capacitive component C2 is connected between the second terminal 602 and a first node N1; the first capacitive component C1 is connected between the first terminal 601 and a second node N2, the third capacitive component C3 is connected between the third terminal 603 and a third node N3. The first resistor $R_{1L}$ is connected between the first node N1 and the second node N2. The second resistor $R_{2L}$ is connected between the second node N2 and the third node N3. The third resistor $R_{1R}$ is connected between the first node N1 and the ground terminal GND. The fourth resistor $R_{2R}$ is connected between the second node N2 and a measuring device 604 (such as a voltmeter) also connected with the ground terminal GND. The fifth resistor $R_{3R}$ is connected between the third node N3 and the ground terminal GND.

Considering as negligible the resistances of the fourth resistor $R_{2R}$, of the third resistor $R_{1R}$ and of the fifth resistor $R_{3R}$ with respect to the internal resistance of the voltmeter 604, a voltage value $V_{out}$ measurable by the voltmeter 604 corresponds to the voltage drop on the second resistor $R_{2L}$. The voltage value $V_{out}$ con be expressed as:

$$V_{out} = I_{C1} R_{par} = 2\pi f C1 V R_{par} \tag{1}$$

where:
$I_{C1}$ is the capacitive current flowing through the first capacitive component C1;
$R_{par}$ is the parallel of the first resistor $R_{1L}$ and the second resistor $R_{2L}$;
V is the voltage applied to the metallic connector 500, the first conductor 300 and second conductor 302 with respect to ground GND;
f is the frequency of voltage V.

The resistance $R_{par}$ can be expressed as:

$$R_{par} = (R_{1L} R_{2L})/(R_{1L} + R_{2L}) \tag{2}$$

The equations reported above links the applied voltage V to the measured voltage value $V_{out}$, by the parameters f, $C_1$, and $R_{par}$.

By measuring the resistance $R_{par}$ prior to the detection and knowing the parameters f and $C_1$ (the latter depends only on the geometry of the joint 200 and on the material used for the joint insulating layer 211) it is possible to calculate the applied voltage V from the measured voltage $V_{out}$.

According to another embodiment, from the measured voltage value $V_{out}$ it is possible to evaluate if the voltage signal value overcomes a voltage threshold to decide about the presence or absence of the applied voltage V in the cables jointed by the joint 200, without calculating a value of the applied voltage V.

The capacitive voltage sensor of the present disclosure can be integrated in any kind of cable joints, in separable connectors or in power cables to measure applied voltage or partial discharge signals.

It is noticed that the capacitive voltage sensor of the present disclosure and the joint incorporating it show advantages over the known devices.

The presence of the sensor conductive layer allows noise shielding of the electrodes. The conductive layer also provides for electrical connection (e.g. with the signal cable) simplifying the sensor structure and reducing or avoiding the number of internal wires.

The capacitive voltage sensor of the disclosure can have a flexible structure that allows non-complex integration in cable joints and manufacturing of fully elastic cable joints.

The joint encompassing the capacitive voltage sensor of the disclosure is provided with continuous screen layer and sheath so providing high safety performances, in accessing the sensor to read the detected voltage. Particularly, the presence of the uninterrupted joint sheath improves the impermeability of the joint.

Contrary to the known joints having a metallic insert, the joint of the present disclosure can be manufactured with an uninterrupted joint semiconductive layer so avoiding discontinuity (circular hole) in this layer. Moreover, as discussed with reference to the equivalent circuit of FIG. 8, the joint of the disclosure operates on the basis a capacitance associated with its insulation and a resistance associated with its semiconductive layer which is part of the joint and is not dependent on external components.

What is claimed is:

1. A shrinkable cable joint comprising:
   a joint insulating layer surrounding a connection region configured to house two connected cable ends;
   a joint semiconductive layer surrounding the joint insulating layer;
   a joint screen layer surrounding the joint semiconductive layer;
   a joint sheath surrounding the joint screen layer; and
   a capacitive voltage sensor arranged between the joint screen layer and the joint semiconductive layer, the capacitive voltage sensor comprising:
      a sensor insulating layer having a first side and an opposite second side;
      a sensor electrode and a guard electrode arranged on the second side and directly contacting the joint semiconductive layer; and
      a sensor conductive layer arranged on the first side and comprising a first conductive layer portion in direct contact with the joint screen layer and electrically coupled to the guard electrode and a second conductive layer portion electrically coupled to the sensor electrode, the sensor conductive layer extending on the first side.

2. The joint of claim 1, wherein the capacitive voltage sensor has a planar structure and a rectangular shape, quadrangular shape, or circular shape.

3. The joint of claim 1, wherein the capacitive voltage sensor is flexible.

4. The joint of claim 1, further including an insulating filler arranged to electrically insulate the first conductive layer portion from the second conductive layer portion.

5. The joint of claim 1, wherein the first conductive layer portion has a first area greater than a second area of the second conductive layer portion.

6. The joint of claim 1, wherein the sensor electrode, the guard electrode and the conductive layer comprise a material selected from: metal, carbon, carbon nano-tube, a conductive polymer, or composites thereof.

7. The joint of claim 1, wherein the sensor insulating layer comprises a material selected from: polyester, polyethylene terephthalate, polyethylene naphthalate, or polyimide.

8. The joint of claim 1, wherein the capacitive voltage sensor is made according to a Flexible Printed Circuit (FPC) Technology.

9. The joint of claim 1, wherein the sensor insulating layer comprises:
   a first conductive element connecting the guard electrode with the first conductive layer portion; and
   a second conductive element connecting the sensor electrode with the second conductive layer portion.

10. The joint of claim 1, further comprising a signal cable comprising:
    a first conductor having a first end connected to the second conductive layer portion and a second end connected to an output port; and
    a second conductor having a third end connected to the first conductive layer portion of the sensor conductive layer and a fourth terminal coupled to the output port.

11. The joint of claim 10, wherein the signal cable is a coaxial cable, a twisted-pair cable, or a shielded flat cable.

12. The joint of claim 1, wherein the capacitive voltage sensor is arranged so as to detect a voltage signal ($V_{out}$) dependent on:
    a capacitance value (C1) associated with the joint insulating layer;
    a first resistance value ($R_{12}$) associated with a portion of the joint semiconductive layer faced to a longitudinal region extending between the sensor electrode and a first portion of the guard electrode; and
    a second resistance value ($R_{24}$) associated with a further portion of the semiconductive layer faced to a further region extending between the sensor electrode and a second portion of the guard electrode, the sensor electrode being arranged between the first portion and the second portion.

13. A power distribution system comprising:
two cable conductors spliced in a shrinkable cable joint, the shrinkable cable joint comprising:
   a joint insulating layer surrounding a connection region configured to house the spliced cable conductors;
   a joint semiconductive layer surrounding the joint insulating layer;
   a joint screen layer surrounding the joint semiconductive layer;
   a joint sheath surrounding the joint screen layer; and
   a capacitive voltage sensor arranged between the joint screen layer and the joint semiconductive layer, the capacitive voltage sensor comprising:
      a sensor insulating layer having a first side and an opposite second side;
      a sensor electrode and a guard electrode arranged on the second side and directly contacting the joint semiconductive layer; and
      a sensor conductive layer arranged on the first side and comprising a first conductive layer portion in direct contact with the joint screen layer and electrically coupled to the guard electrode and a second conductive layer portion electrically coupled to the sensor electrode, the sensor conductive layer extending on the first side.

\* \* \* \* \*